(12) United States Patent
Sivverini et al.

(10) Patent No.: US 12,710,473 B2
(45) Date of Patent: Aug. 18, 2026

(54) FAULT DETECTION FOR SWITCHED-MODE CONVERSION CIRCUIT

(71) Applicant: Analog Devices International Unlimited Company, Limerick (IE)

(72) Inventors: Claudio Sivverini, Catania (IT); Benedetto Marco Marletta, Catania (IT)

(73) Assignee: Analog Devices International Unlimited Company, Limerick (IE)

( * ) Notice: Subject to any disclaimer, the term of this patent is extended or adjusted under 35 U.S.C. 154(b) by 179 days.

(21) Appl. No.: 18/821,758

(22) Filed: Aug. 30, 2024

(65) Prior Publication Data

US 2026/0063716 A1 Mar. 5, 2026

(51) Int. Cl.

| | |
|---|---|
| ***G01R 31/02*** | (2006.01) |
| ***G01R 19/165*** | (2006.01) |
| ***G01R 31/327*** | (2006.01) |
| ***H02M 1/32*** | (2007.01) |

(52) U.S. Cl.
CPC ... *G01R 31/3277* (2013.01); *G01R 19/16576* (2013.01); *H02M 1/32* (2013.01)

(58) Field of Classification Search
CPC ......... G01R 31/3277; G01R 19/16576; H02M 1/32; H02M 1/36; H02M 3/158
See application file for complete search history.

(56) References Cited

U.S. PATENT DOCUMENTS

| | | | | |
|---|---|---|---|---|
| 10,917,012 | B1 * | 2/2021 | Heiling | H02M 1/08 |
| 2010/0181977 | A1 * | 7/2010 | Sohma | H02M 3/156 323/282 |
| 2010/0259233 | A1 * | 10/2010 | Cheng | H02M 3/1588 323/265 |
| 2012/0293156 | A1 * | 11/2012 | Galbis | H02M 3/1588 323/350 |
| 2014/0077790 | A1 * | 3/2014 | Sohma | H02M 3/1588 323/313 |
| 2021/0367504 | A1 * | 11/2021 | Angell | H02M 1/14 |

* cited by examiner

*Primary Examiner* — Thang X Le
(74) *Attorney, Agent, or Firm* — Schwegman Lundberg & Woessner, P.A.

(57) ABSTRACT

In a switched-mode conversion circuit, fault detection can be performed. For example, the switched-mode conversion circuit can include a control circuit comprising a fault detection circuit, the fault detection circuit comprising an excitation circuit configured to generate a reference current routed to a switching node to flow through a path including the inductive element, and a detection circuit configured to monitor a voltage elicited at the switching node in response to a discontinuity in the reference current generated by the excitation circuit. The control circuit can determine, using the detection circuit, a presence or absence of a ringing signal in response to the discontinuity in the reference current, and, in response, to declare a fault in the absence of the ringing signal, such as indicative of a short-to-ground or other fault condition.

20 Claims, 4 Drawing Sheets

FAULT DETECTION FOR SWITCHED-MODE CONVERSION CIRCUIT

FIELD OF THE DISCLOSURE

This document pertains generally, but not by way of limitation, to fault detection for a switched-mode conversion circuit, and more particularly, to detection of a fault a switching node of a switched-mode conversion circuit, such as in relation to startup.

BACKGROUND

Switched-mode power conversion circuits can be used in a variety of applications, such as where one or more regulated voltage outputs are desired. Generally, a switched-mode conversion circuit is operated according to switching cycles where discrete amounts of energy are transferred to an energy storage device from an energy source, and then from the energy storage device to a load. Switched-mode conversion circuits can be fed from alternating current (AC) or direct current (DC) energy sources, in accordance with different topologies and operational characteristics.

A variety of different topologies can be used for applications involving voltage reduction (e.g., "buck" conversion), voltage increase (e.g., "boost" conversion), or both (e.g., "buck/boost" conversion). Generally, in a switched-mode power conversion circuit, an energy storage element is used, such as an electromagnetic device (e.g., a single inductor or coupled configuration such as a transformer-coupled configuration). The energy storage element is energized (e.g., "charged") and then an energy source is de-coupled from the energy storage element, and the energy storage element can then dump stored energy into a load device. Switching cycles can be established using one or more power switching devices, such as transistor devices. Routing of output current to the load can be accomplished using control of such switching devices along with one or more rectifier structures (e.g., passive rectification) or transistor devices controlled to provide rectification (e.g., active rectification). Transistor devices, rectifiers, and energy storage devices can be discrete, such as external to a monolithic integrated circuit device package, or combinations of such devices can be co-integrated. Generally, a physical size of inductive devices may preclude monolithic co-integration, but such inductive devices can be co-integrated within a module package, such as with power switching devices or other elements.

SUMMARY OF THE DISCLOSURE

Switched-mode power conversion circuits can include a variety of different circuit elements, as discussed above. Such circuit elements can be co-integrated within an integrated circuit package or module package. Such circuit elements can include discrete components that are coupled externally to a monolithic integrated circuit or module, as illustrative examples. Various defects or faults can exist in switched-mode power conversion circuits. For example, such faults can include interconnection faults comprising open-circuit or short-circuit configurations, or other faults such as missing or incorrect components, or damaged components, as illustrative examples. A control circuit can be used to perform a fault detection routine, such as associated with a startup routine of a switched-mode conversion circuit. Such fault detection can be used to evaluate whether a fault exists, and, optionally, in the presence of detected fault, to inhibit operation of the switched-mode conversion circuit such as to avoid damage to conversion circuitry or a load that may be connected to the conversion circuitry.

In one approach, fault detection can be performed such as by injecting a specified current through a path leading to an output capacitor of the switched mode conversion circuit. A voltage developed at the output capacitor can be monitored and if the capacitor fails to charge to a specified voltage within a specified amount of time, a fault at a switching node can be indicated such as corresponding to a short or low-resistance pathway to another node (e.g., a short to "ground"). The present inventors have recognized that such a capacitor charging approach can present various challenges. For example, a charging duration (and corresponding time constant) associated with the output capacitor will depend on an output capacitor value, and such output capacitor values can vary according to different end-user applications. Also, a duration of such a charging duration or time constant may be undesirably long (e.g., greater than 1 millisecond or longer) for typical values of output capacitors and the injected fault detection current (e.g., tens or hundreds of milliamps).

The present inventors have recognized, among other things, that a fault detection can be performed such as be introducing a discontinuity in an injected current and monitoring a node such as switching node coupled to an energy storage inductor, for an indication that ringing (e.g., damped sinusoidal oscillation) is occurring. In the presence of various faults, such as a short or low resistance pathway to another node, a ringing waveform may have lower peak amplitude, or ringing may be suppressed entirely. Accordingly, an absence of a ringing waveform reaching a specified amplitude threshold within a specified duration can indicate a fault. Use of detection of a ringing signal in response to a current discontinuity can also provide other attributes. For example, a ringing signal peak amplitude can be reached in as few as a single cycle of the ringing waveform, providing faster fault detection (e.g., less latency) as compared to an output capacitor charging approach. Such ringing will generally have a natural frequency that is dominated by a parasitic capacitance value at the switching node (or other node) being monitored and an inductance value of the energy storage inductor. Accordingly, use of a fault detection approach where a ringing signal is detected can provide immunity to variation in output capacitor size. Such an approach can, but need not, use current injection circuitry similar to an output capacitor charging fault detection approach, such-as supporting a mode selection between current-discontinuity-based ringing detection or output capacitor charging, depending on application or end-user specifications.

In an example, a method, such as implemented in an integrated circuit, can include detecting a fault at a switching node of a switched-mode conversion circuit, the method comprising establishing a current discontinuity through an inductive element, in response to the current discontinuity, monitoring a voltage at a switching node coupled to the inductive element and a power switching device forming a portion of the switched-mode conversion circuit, using the monitoring, determining a presence or absence of a ringing signal, and declaring a fault in the absence of the ringing signal.

In an example, establishing the current discontinuity comprises enabling or suppressing a reference current through the inductive element using a current source circuit separate from the power switching device. In an example, the power switching device is in a non-conducting state when the current discontinuity is established, and the power switching device is inhibited from entering a conductive state in response to the fault being declared.

In an example, a switched-mode conversion circuit can include or use a method as described in this document. For example, the switched-mode conversion circuit can include or use a switching node coupling a power switching device to an inductive element, a control circuit comprising a fault detection circuit, the fault detection circuit comprising an excitation circuit configured to generate a reference current routed to the switching node to flow through a path including the inductive element and a detection circuit configured to monitor a voltage elicited at the switching node in response to a discontinuity in the reference current generated by the excitation circuit. The control circuit can be configured to determine, using the detection circuit, a presence or absence of a ringing signal in response to the discontinuity in the reference current, and, in response, to declare a fault in the absence of the ringing signal.

In an example, a switched-mode conversion circuit can include or use a method as described in this document. For example, the switched-mode conversion circuit can include or use a switching node coupling a power switching device to an inductive element, a control circuit comprising a fault detection circuit, the fault detection circuit comprising, an excitation circuit configured to generate a reference current routed to the switching node to flow through a path including the inductive element and a detection circuit configured to monitor a voltage elicited at the switching node in response to a discontinuity in the reference current generated by the excitation circuit. The control circuit can be configured to determine, using the detection circuit, a presence or absence of a ringing signal in response to the discontinuity in the reference current, and, in response, to declare a fault in the absence of the ringing signal, hold the power switching device in a non-conducting state during which the current discontinuity is established, and inhibit the power switching from entering a conductive state in response to the fault being declared. The switched-mode conversion circuit of the examples above or other examples herein can include a buck converter topology including the power switching device and the inductive element, or another different topology.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Fault detection in a switched-mode conversion circuit can be performed by introducing a discontinuity in an injected current and monitoring a node such as switching node coupled to an energy storage inductor. Such monitoring can provide an indication that ringing (e.g., damped sinusoidal oscillation) is occurring. In the presence of various faults, such as a short or low resistance pathway to another node, a ringing waveform may have lower peak amplitude, or ringing may be suppressed entirely. Accordingly, an absence of ringing or a ringing waveform failing to reach a specified amplitude threshold within a specified duration can indicate a fault. The circuitry and techniques described herein can perform fault detection more rapidly independent of load or output capacitor value, using a current discontinuity for excitation, as compared to a constant-current capacitor charging technique as discussed above.

Figure 1:
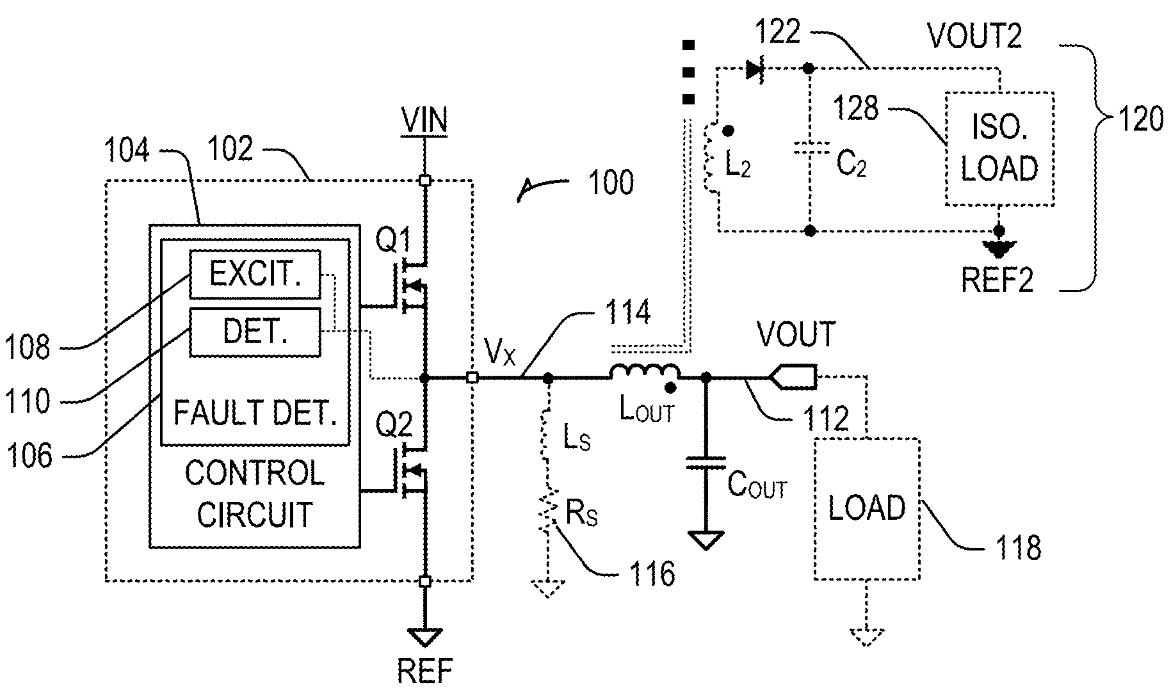
FIG. 1 illustrates generally an illustrative example comprising a switched-mode conversion circuit comprising a buck regulation topology.

The present subject matter is generally applicable to switched-mode conversion circuits, with FIG. 1 showing an illustrative example of a switched-mode conversion circuit 100 comprising a buck regulation topology. The configuration of FIG. 1 shows a half-bridge structure comprising power switching field effect transistors (FETs) Q1 and Q2 arranged to controllably connect an input node, VIN, or a reference node, REF (e.g., ground), respectively, to a switching node 114, $V_X$, according to gate drive signals provided by a control circuit 104. The control circuit 104 can include a state machine architecture, microcontroller, or microprocessor architecture, as illustrative (but non-limiting) examples. The control circuit 104 can be configured to provide analog drive signals suitable for controlling power switching devices such as Q1 and Q2. For example, switching cycles established by a control circuit 104 can deliver energy from the input node VIN to the output node, VOUT, such as establishing a specified output voltage at the VOUT node 112 that is less than the voltage VIN (in the “buck” configuration shown in the switched-mode conversion circuit 100).

When FETs Q1 and Q2 are in an off-state (e.g., non-conducting), such FETs can behave like passive rectifiers. The present inventors have recognized, among other things, that a parasitic capacitance at the node $V_X$, in combination with an inductance of a storage inductor, $L_{OUT}$, can form an LC tank circuit. Accordingly, a fault detection circuit 106 can include an excitation circuit 108, such as a current source, and a detection circuit 110, such as configured to induce and detect LC resonance oscillation (e.g., a ringing signal comprising a damped exponential waveform). A natural frequency of such oscillation is dominantly influenced by the parasitic capacitance at the switching node $V_X$, and such natural frequency does not generally depend on an output capacitor $C_{OUT}$ value, which may vary depending on application. FETs Q1 and Q2 can be integrated within an integrated circuit package 102, such as discretely within a module or monolithically co-integrated. In another example, FETs Q1 and Q2 can be discrete and external to the integrated circuit package 102.

The approach described in this document is applicable to switched-mode circuit topologies other than the switched-mode conversion circuit 100 shown in FIG. 1. For example, the switched-mode conversion circuit can be isolated, having an output transformer between the switching node $V_X$, energy storage inductor $L_{OUT}$, and the load 118. A coupled inductor topology could also be used, such as to support one or more isolated output blocks such as a block 120 including a coupled inductor $L_2$, output capacitor $C_2$, isolated reference node REF2, to serve an isolated load 128 using a second output 122, VOUT2.

Causes of faults where $V_X$ is connected to another node such as the REF node (illustrated by a defect 116 having resistance RS) can include assembly defects or module failures, such as due to soldering defects, printed circuit board or bond-wire failures, or integrated circuit defects, as illustrative (but non-limiting) examples. Such defects can be internal or external to the integrated circuit package 102. As discussed above, detection of a fault, such as the presence of a defect 116, during startup can help to protect the switched-mode conversion circuit 100 or load 118 from damage, such as by inhibiting switching operation in the presence of the defect 116.

Figure 2:
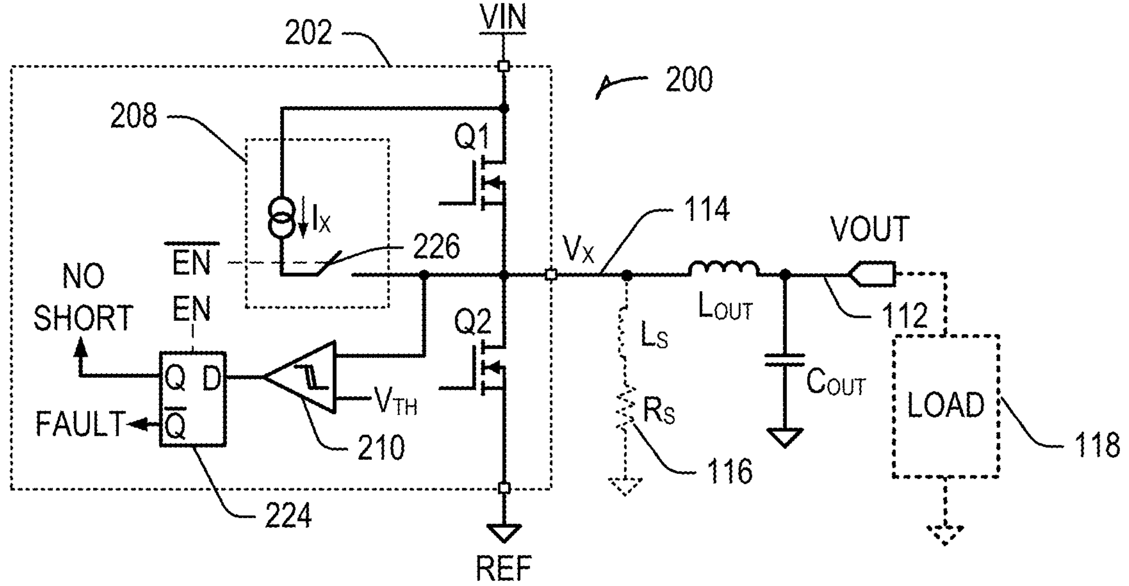
FIG. 2 illustrates generally an illustrative example comprising a switched-mode conversion circuit comprising a buck regulation topology, comprising a controllable current source and a threshold comparator.

FIG. 2 illustrates generally an illustrative example comprising a switched-mode conversion circuit 200 comprising a buck regulation topology similar to the switched-mode conversion circuit 100 of FIG. 1. In FIG. 2, an excitation circuit 208 can include a controllable current source, such as can be enabled or disabled or having an output that is switched using a switch 226. Enabling or disabling the controllable current source can include using an integrated current-mirror architecture where one portion (e.g., a reference leg) of the current mirror can be enabled or disabled to control an output of another leg. A monitoring circuit 210 can be implemented using a threshold comparator circuit, such as operating in a voltage mode to compare a voltage at the switching node 114, $V_X$, against a threshold $V_{TH}$. A presence of a ringing signal having a magnitude exceeding $V_{TH}$ can be used to provide a FAULT or NO SHORT indication, such as using a latch 224 coupled to an output of the threshold comparator circuit. As in the example of FIG. 1, a defect 116 can include a path between the switching node 114, $V_X$, and a reference node, REF, represented by a resistance $R_S$.

In one approach, the defect 116 can be detected by routing a constant current (e.g., a DC current $I_X$) generated by the excitation circuit 208 through the $V_X$ node over a specified duration. Under nominal, no-fault conditions, the current $I_X$ flows through an energy storage inductor $L_{OUT}$ (generally external to an integrated circuit package 202) to charge an output capacitor $C_{OUT}$. The voltage developed across $C_{OUT}$, VOUT, at an output node 112 generally obeys the relationship $$VOUT(t) = \frac{Ix * t}{C_{OUT}}.$$

If a rate of change of VOUT is relatively slow, the voltage at the switching node 114 will also increase linearly versus time in response to injection of the current $I_X$. Values for $I_X$, $C_{OUT}$, and time allow calculation of a nominal voltage profile versus time, such as corresponding to a target voltage value corresponding to a specified charging duration under nominal conditions. The threshold comparator circuit can be used to detect whether $V_X$ is above a specified threshold, $V_{TH}$. If the threshold is achieved or exceeded, as indicated by the monitoring circuit 210, the defect 116 can be assumed to be absent (e.g., the switching node 114 does not have a low-resistance fault path to the reference node, REF, through the defect 116). If, after a specified duration, $V_X$ does not cross the threshold, the defect 116 may exist, indicating a fault. This approach of charging the $C_{OUT}$ capacitor using the excitation circuit 208 generally cannot distinguish between the defect 116 being located between the switching node 114 and the reference node, versus a separate fault where the VOUT node 112 is shorted to the reference node. Another potential drawback of using $C_{OUT}$ charging is that the load 118 may also shunt the charging current $I_X$, affecting the charging time of the capacitor $C_{OUT}$ and potentially causing a false positive detection event where the voltage at the switching node 114 fails to cross the threshold $V_{TH}$ within the specified duration. Yet another potential drawback is that variation in the output capacitor $C_{OUT}$ value affects charge time, and a time constant associated with such charging may be relatively long (e.g., greater than 1 millisecond), or may result in an undesirable residual voltage on $C_{OUT}$ during startup.

By contrast, the present inventors have recognized, among other things, that a forced current approach may still be used, but a discontinuity in such forced current $I_X$ can be induced, such as to cause alternating current (AC) excitation of the output storage inductor $L_{OUT}$, as discussed above. A current discontinuity can be generated using various approaches, such as where a pulsed current is generated using a charged capacitor circuit, or a DC current, $I_X$, is either initiated or terminated abruptly, such as using a switch 226 or other approach as discussed above. Also as discussed above and elsewhere herein, oscillation (e.g., a ringing signal) can be induced at the switching node 114, $V_X$, in response to a current discontinuity, due to a combination of a parasitic capacitance and the output inductor $L_{OUT}$ value, with such natural frequency being substantially invariant for different $C_{OUT}$ values. Such oscillation can have a cycle duration (period) that is much shorter than a corresponding charge time where a $C_{OUT}$ charging approach is used, which allows much faster detection of whether the defect 116 exists. If a step discontinuity is induced in the current $I_X$, such a step discontinuity can be established such that a transition from enabled to disabled or vice versa is at least ten times faster than a ringing cycle duration under nominal (e.g., no-fault) conditions.

As an illustration, the following analysis shows that a peak voltage amplitude, V0, corresponding to an elicited voltage in ringing signal, and period of oscillation, T, can be represented as a function of current amplitude, $I_X$, output inductance L, parasitic capacitance at the switching node 114, $V_X$, represented by $C_X$ such that:

$$VO = I_X\sqrt{L/C_X}\text{; and} \quad \text{EQN. (1)}$$

$$T = 2\pi\sqrt{LC_X}. \quad \text{EQN. (2)}$$

Assuming that $I_X$=127 milliamps (mA), L=50 nanohenry (nH), $C_X$=6.5 nanofarads (nF), then VO=317.5 millivolts (mV) and T=113.2 nanoseconds (ns). Such values indicate that the fault detection operation can be performed in less time than a corresponding output capacitor charging technique. A comparator circuit or other monitoring circuit with comparatively lower latency can be used for a ringing detection technique (e.g., having less than 1 millisecond of latency or propagation delay), such as at startup before output transistor Q1 and Q2 operation is permitted. For example, during startup, switching cycles are inhibited, and can continue to be inhibited in response to a fault being detected to avoid damage, such as entirely preventing switching cycles in the presence of a fault detected at startup. As an illustration, a latency specified for comparing the monitored voltage with a specified threshold using the comparator circuit and latching the output corresponds, in total, to a duration as short as a single cycle of damped oscillation of the ringing signal when the inductive element is present and no fault exists. In this manner, detection of the ringing signal can occur, for example, within a period of a single cycle of oscillation.

As shown in FIG. 1 and FIG. 2, any physical fault such as a short represented by $R_S$ will generally also exhibit some degree of parasitic reactance, such as an inductance $L_S$ (which could be modeled as either a parallel or series inductance, or combination thereof). Accordingly, an LC resonance associated with the fault parasitic inductance $L_S$ and other parasitic capacitance could also cause a detectable ringing signal, though this would generally have a very different (generally much higher) natural frequency than that associated with a parasitic capacitance and the output inductor $L_{OUT}$ value. The present inventors have recognized that for most practical applications, an $L_S$ (fault parasitic self-inductance value) will generally be less than 3 nH. By contrast, other inductors in the circuit such as $L_{OUT}$ or associated with a downstream LC filter circuit may be orders of magnitude larger, such as 200 nH or larger. False fault detection based on parasitic fault inductance can be suppressed, such as by enabling the comparator circuit of FIG. 2 only during a specified time window or after a specified time delay, after the current discontinuity, to avoid false triggering from ringing associated with the fault inductance (when present). A peak amplitude of a ringing signal associated with the fault inductance will also generally be lower in amplitude than the ringing signal associated with $L_{OUT}$, so false triggering can also be controlled to some degree by selection of an appropriate $V_{TH}$.

Even if a fault exhibits parasitic inductance $L_S$ is sufficient to cause detectable ringing, the techniques described herein (such as including delayed enable of comparator operation after current discontinuity) can suppress false fault detection when the following constraints are met: maximum parasitic $L_S$ value is smaller than minimum $L_{OUT}$ value, and maximum parasitic $L_S$ value is higher than the shunt inductance associated with a particular application. As an illustrative example, in an application where $L_{OUT}$ or another inductor (such as forming part of an LC filter network) is 200 nH, and an expected short parasitic inductance $L_S$ is 3 nH, a comparator delay (e.g., a delay before comparator detection is enabled after the current discontinuity) can be specified such that any parasitic inductance value below 20 nH will be registered as a fault (e.g., will not be allowed to trip the comparator with a false ringing signal).

Figure 3A:
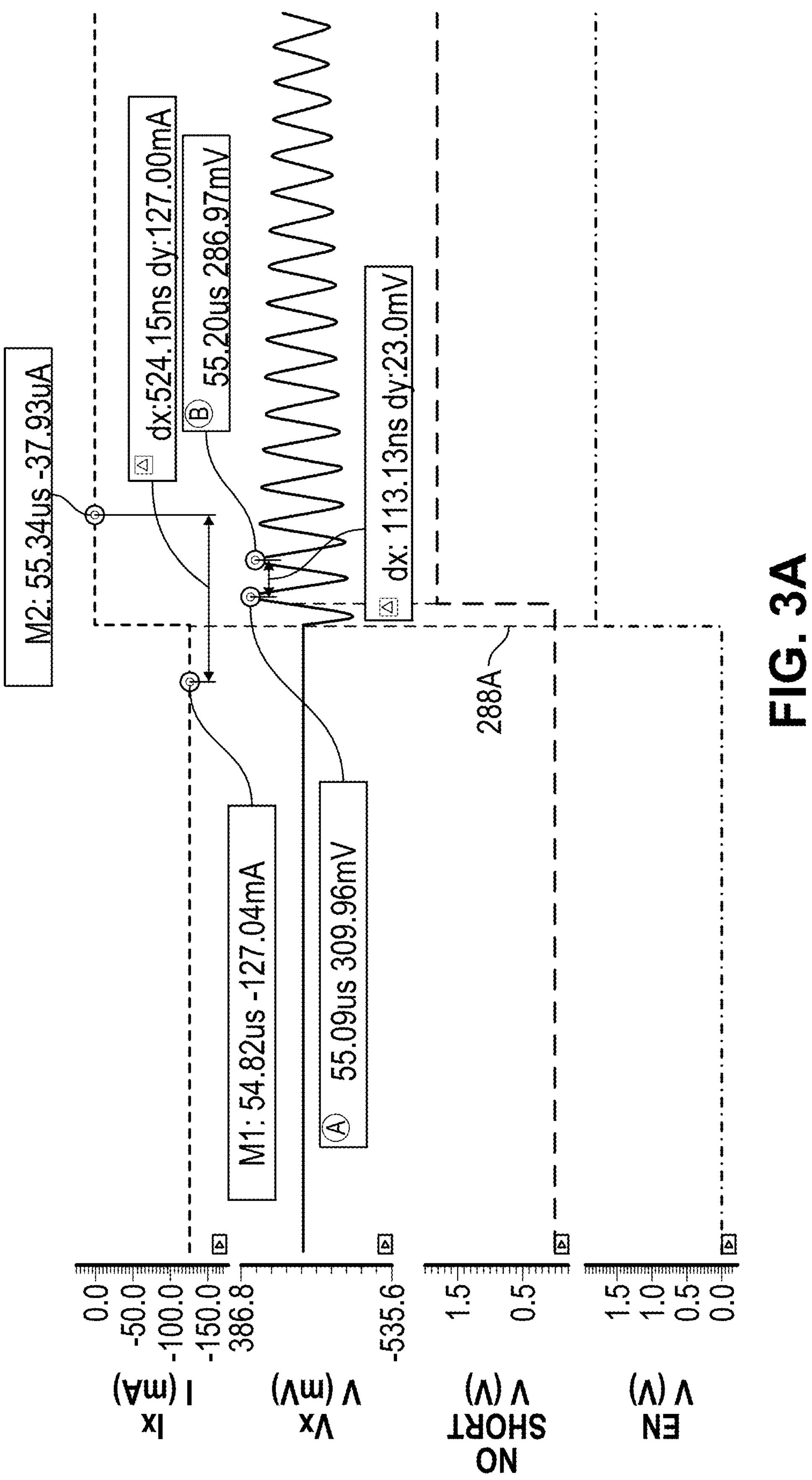
FIG. 3A illustrates generally various plots showing startup behavior of the switched-mode conversion circuit of FIG. 2, in the absence of a fault.
Figure 3B:
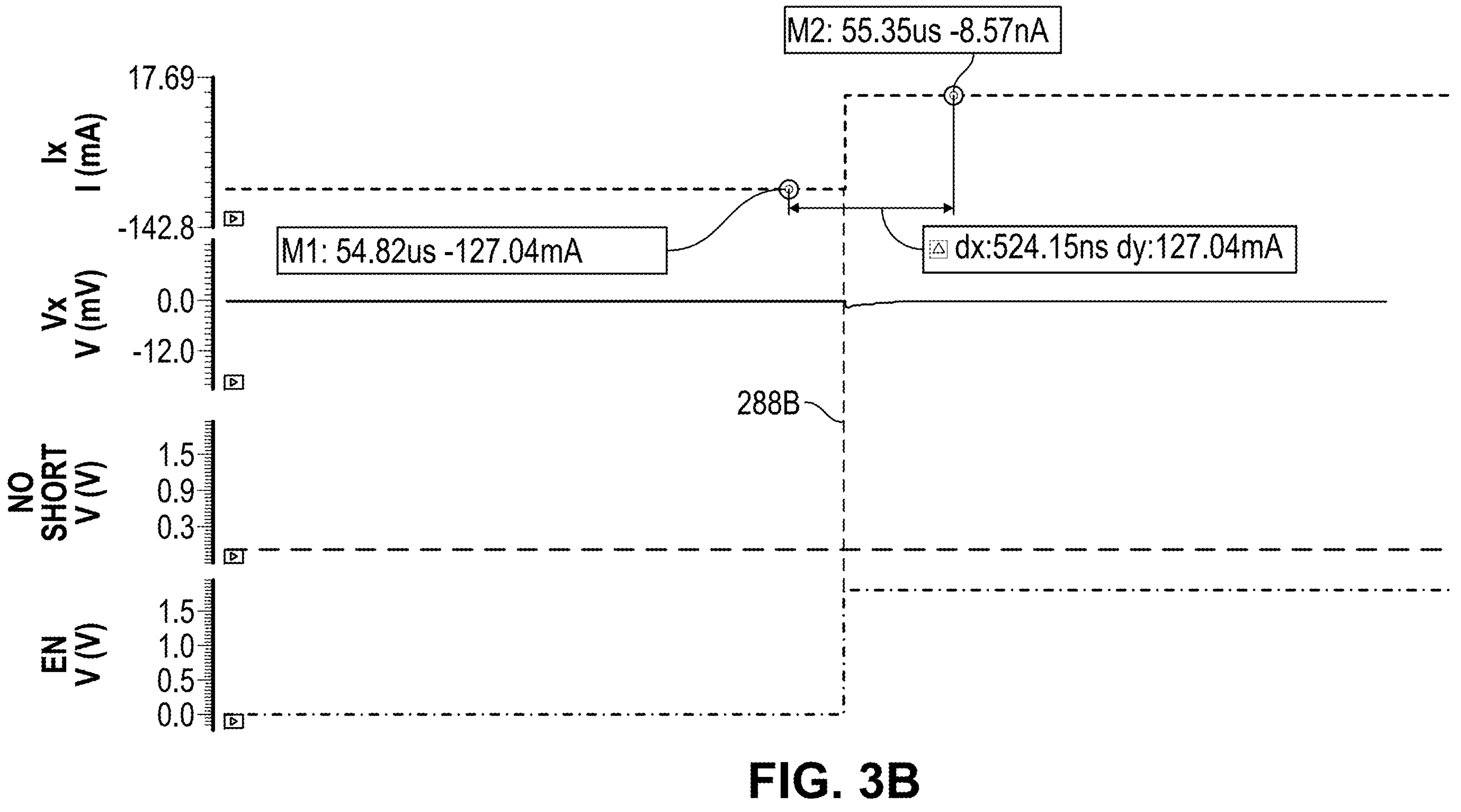
FIG. 3B illustrates generally various plots showing startup behavior of the switched-mode conversion circuit of FIG. 2, in the presence of fault.

FIG. 3A illustrates generally various plots showing startup behavior of the switched-mode conversion circuit of FIG. 2, in the absence of a fault and FIG. 3B illustrates generally various plots showing startup behavior of the switched-mode conversion circuit of FIG. 2, in the presence of fault. In FIG. 3A and FIG. 3B, signals EN and NO SHORT can correspond to annotations shown in FIG. 2. Referring to FIG. 3A, for example, a control signal EN transitioning from logic low to logic high at time 288A can terminate an output current $I_X$ (to create a transition from sinking 128 mA to zero mA), creating a discontinuity to excite ringing. This can correspond to opening a switch 226 as shown in FIG. 2 to interrupt a direct current (DC) fixed current source (or sink) or using another approach to create the current discontinuity (e.g., creating a rising or falling edge defining a discontinuity such as by enabling or disabling a current reference forming a portion of a current mirror circuit topology).

In the presence of ringing, NO SHORT can transition from logic low to logic high, being latched to indicate that no fault was detected, because the ringing signal at $V_X$ exceeded a specified amplitude threshold within a specified duration. Referring to FIG. 3B, if a defect 116 as shown in FIG. 2 is present, the current discontinuity initiated at time 288B by the control signal EN fails to excite ringing in signal $V_X$. Accordingly, NO SHORT remains in a logic low state (e.g., a comparator circuit or other monitoring circuit 210 as shown in FIG. 2 fails to detect a $V_X$ ringing signal has a magnitude that fails to exceed a specified threshold).

For example, in the illustrations of FIG. 3A and FIG. 3B, the specified threshold VTH is 35 mV. If NO SHORT remains low (or a complementary signal FAULT remains high), as provided at the latch 224 output in FIG. 2, a fault can be declared. Switching cycles can be inhibited in response to a fault being declared. In this manner, power switching devices can be inhibited from entering a conductive state to avoid damage (e.g., the control circuit can hold such devices in a non-conducting state such as by generation or suppression of gate control signals or other signals). The fault detection scheme discussed herein can be combined with other fault detection approaches, such as over-current or over-voltage protection (or combinations thereof), in isolated or non-isolated switching converter topologies.

Figure 4:
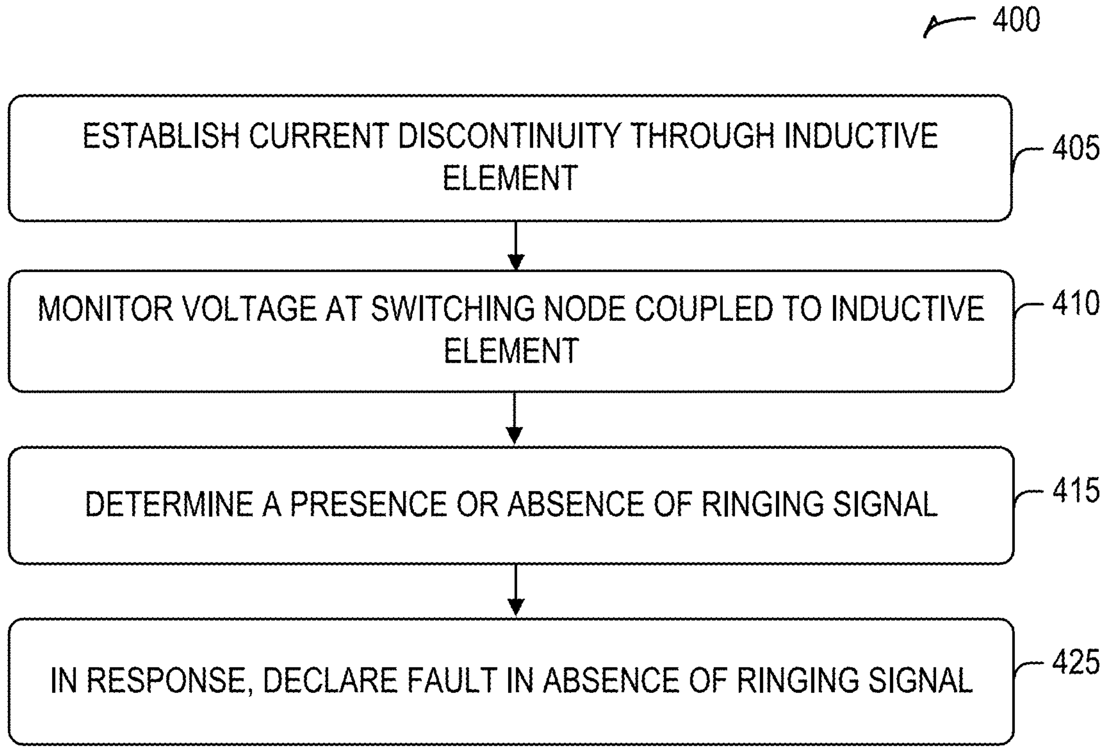
FIG. 4 illustrates generally a technique, such as a method for operation of a switched-mode conversion circuit, which can include performing fault detection.

FIG. 4 illustrates generally a technique 400, such as a method for operation of a switched-mode conversion circuit, which can include performing fault detection. The technique 400 can be, for example, implemented as an embedded or integrated circuit realization to perform control of a power conversion integrated circuit, such as forming a portion of a monolithically integrated power conversion controller circuit forming a portion of an integrated circuit package or integrated module package. At 405, a current discontinuity can be established through an inductive element. The current discontinuity can include a step discontinuity where a steady state current is established or interrupted or using another approach. The current discontinuity is separate from switched current pulses associated with normal voltage conversion operation of the switched-mode conversion circuit (e.g., switching by power switching devices can be disabled while fault detection is performed). At 410, a voltage can be monitored at a switching node coupled to an inductive element. Generally, such monitoring (e.g., using a threshold comparator) can indicate whether a ringing signal is induced at the switching node. Such ringing behavior is not referring to flyback conversion circuit operation, but instead can be associated with LC resonance established by a combination of parasitic capacitance and a storage inductor inductance, though the fault detection technique described herein could be applied to flyback conversion topologies.

At 415, a presence or absence of a ringing signal can be determined, such as by enabling a threshold comparator over a specified time duration (e.g., a sample window), and latching an output indication from the threshold comparator using a latch. At 425, an output of the latch can indicate whether a fault has been detected (e.g., where a fault is declared in response to an output of the latch circuit indicating that a ringing signal is absent or the switching node amplitude is below a specified voltage threshold). The presence of a declared fault can be used to control operation of the switched mode conversion circuit, such as by suppressing or inhibiting operation of power switching devices (e.g., holding such devices in a non-conductive state to avoid coupling an input node to ground through a short-circuit fault).

VARIOUS NOTES

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc., are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Such instructions can be read and executed by one or more processors to enable performance of operations comprising a method, for example. The instructions are in any suitable form, such as but not limited to source code, compiled code, interpreted code, executable code, static code, dynamic code, and the like.

Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A method for detecting a fault at a switching node of a switched-mode conversion circuit, the method comprising:

using an excitation circuit to establish a current discontinuity in a reference current directed through an inductive element;

in response to the current discontinuity, using a detection circuit to monitor a voltage at a switching node coupled to the inductive element and a power switching device forming a portion of the switched-mode conversion circuit;

based on the monitoring, using a control circuit to determine a presence or absence of a ringing signal in response to the current discontinuity in the reference current; and declaring, by the control circuit, a fault in the absence of the ringing signal.

2. The method of claim 1, wherein the establishing the current discontinuity comprises enabling or suppressing a reference current through the inductive element using a current source circuit separate from the power switching device.

3. The method of claim 2, wherein the reference current comprises a direct current (DC) reference current; and wherein establishing the current discontinuity comprises establishing the DC reference current and interrupting the DC reference current.

4. The method of claim 2, wherein the power switching device is in a non-conducting state when the current discontinuity is established; and wherein the power switching device is inhibited from entering a conductive state in response to the fault being declared.

5. The method of claim 4, wherein the inhibiting the power switching device from entering the conductive state comprises suppressing switching cycles in response to the fault being declared.

6. The method of claim 5, wherein the establishing the current discontinuity, the monitoring, the determining the presence or the absence of the ringing signal, and the declaring the fault occur as a portion of a startup process; and wherein the suppressing switching cycles in response to a fault being declared comprises entirely preventing switching cycles to inhibit damage in response to the startup process.

7. The method of claim 1, wherein determining a presence or absence of a ringing signal comprises comparing the monitored voltage with a specified threshold; and in response, declaring a fault in the absence of the monitored voltage achieving or exceeding a magnitude corresponding to the specified threshold.

8. The method of claim 7, wherein a latency associated with the comparing the monitored voltage with the specified threshold corresponds to a duration of a cycle of damped oscillation of the ringing signal when the inductive element is present and no fault exists.

9. The method of claim 7, wherein a duration of a transition associated with the current discontinuity is at least ten times shorter than a duration of a cycle of damped oscillation of the ringing signal when the inductive element is present and no fault exists.

10. The method of claim 9, wherein the transition comprises a rising edge or a falling edge defining the current discontinuity.

11. The method of claim 1, wherein a cycle of damped oscillation of the ringing signal when the inductive element is present and no fault exists is substantially invariant for different output capacitor values for an output capacitor connected to a node other than the switching node.

12. A switched-mode conversion circuit comprising:

a switching node coupling a power switching device to an inductive element; and a control circuit comprising a fault detection circuit, the fault detection circuit comprising:

an excitation circuit configured to generate a reference current routed to the switching node to flow through a path including the inductive element; and a detection circuit configured to monitor a voltage elicited at the switching node in response to a discontinuity in the reference current generated by the excitation circuit;

wherein the control circuit is configured to determine, using the detection circuit, a presence or absence of a ringing signal in response to the discontinuity in the reference current, and, in response, to declare a fault in the absence of the ringing signal.

13. The switched-mode conversion circuit of claim 12, method of claim 1, wherein the control circuit is configured to establish the current discontinuity by enabling or disabling a current source included as a portion of the excitation circuit.

14. The switched-mode conversion circuit of claim 12, wherein the control circuit is configured to hold the power switching device in a non-conducting state during which the current discontinuity is established; and wherein the control circuit is configured to inhibit the power switching from entering a conductive state in response to the fault being declared.

15. The switched-mode conversion circuit of claim 12, wherein the detection circuit comprises a comparator circuit configured to compare the monitored voltage with a specified threshold; and wherein the control is circuit is configured to declare a fault in the absence of the monitored voltage achieving or exceeding a magnitude corresponding to the specified threshold as indicated by the comparator circuit including latching an output from the comparator circuit.

16. The switched-mode conversion circuit of claim 15, wherein a latency associated with the comparing the monitored voltage with the specified threshold using the comparator circuit and latching the output corresponds, in total, to a duration of a cycle of damped oscillation of the ringing signal when the inductive element is present and no fault exists.

17. The switched-mode conversion circuit of claim 15, wherein a duration of a transition associated with the current discontinuity is at least ten times shorter than a duration of a cycle of damped oscillation of the ringing signal when the inductive element is present and no fault exists.

18. The switched-mode conversion circuit of claim 12, further comprising the power switching device and the inductive element.

19. The switched-mode conversion circuit of claim 18, comprising a buck converter topology including the power switching device and the inductive element.

20. A switched-mode conversion circuit comprising:

a switching node coupling a power switching device to an inductive element;

a control circuit comprising a fault detection circuit, the fault detection circuit comprising:

an excitation circuit configured to generate a reference current routed to the switching node to flow through a path including the inductive element; and a detection circuit configured to monitor a voltage elicited at the switching node in response to a discontinuity in the reference current generated by the excitation circuit;

wherein the control circuit is configured to:

determine, using the detection circuit, a presence or absence of a ringing signal in response to the discontinuity in the reference current, and, in response, to declare a fault in the absence of the ringing signal;

hold the power switching device in a non-conducting state during which the current discontinuity is established; and inhibit the power switching from entering a conductive state in response to the fault being declared.

* * * * *